(12) United States Patent
Su et al.

(10) Patent No.: US 8,415,732 B2
(45) Date of Patent: Apr. 9, 2013

(54) TRENCH-CAPACITOR DRAM DEVICE AND MANUFACTURE METHOD THEREOF

(75) Inventors: Yi-Nan Su, Tao-Yuan (TW); Yung-Chang Lin, Tai-Chung Hsien (TW); Jun-Chi Huang, Tai-Chung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 663 days.

(21) Appl. No.: 11/927,700

(22) Filed: Oct. 30, 2007

(65) Prior Publication Data
US 2008/0048232 A1 Feb. 28, 2008

Related U.S. Application Data

(62) Division of application No. 11/420,222, filed on May 25, 2006, now Pat. No. 7,351,634.

(51) Int. Cl.
*H01L 27/108* (2006.01)
(52) U.S. Cl.
USPC ..... 257/301; 257/304; 257/305; 257/E27.092
(58) Field of Classification Search .......... 257/301–310, 257/E27.092
See application file for complete search history.

(56) References Cited

U.S. PATENT DOCUMENTS

| | | | | |
|---|---|---|---|---|
| 4,577,395 A | * | 3/1986 | Shibata | 438/386 |
| 4,918,499 A | * | 4/1990 | Matsutani et al. | 257/304 |
| 5,182,224 A | * | 1/1993 | Kim et al. | 438/243 |
| 5,250,458 A | * | 10/1993 | Tsukamoto et al. | 438/244 |
| 5,258,321 A | * | 11/1993 | Shimizu et al. | 438/244 |
| 5,315,543 A | | 5/1994 | Matsuo | |
| 5,349,218 A | * | 9/1994 | Tadaki et al. | 257/296 |
| 5,386,131 A | * | 1/1995 | Sato | 257/301 |
| 5,432,113 A | * | 7/1995 | Tani | 438/386 |
| 5,594,682 A | * | 1/1997 | Lu et al. | 365/149 |
| 5,595,926 A | * | 1/1997 | Tseng | 438/243 |
| 5,635,740 A | * | 6/1997 | Toshiyuki et al. | 257/305 |
| 6,391,721 B2 | * | 5/2002 | Nakagawa | 438/259 |
| 2005/0186730 A1 | * | 8/2005 | Hsu | 438/243 |
| 2006/0008976 A1 | * | 1/2006 | Tu | 438/238 |
| 2006/0270150 A1 | | 11/2006 | Lee | |

* cited by examiner

*Primary Examiner* — H. Jey Tsai
(74) *Attorney, Agent, or Firm* — Winston Hsu; Scott Margo

(57) ABSTRACT

A method for fabricating a trench capacitor is disclosed. A substrate having a first pad layer is provided. STI structure is embedded into the first pad layer and the substrate. A second pad layer is deposited over the first pad layer and the STI structure. Two adjacent trenches are etched into the first, second pad layers, and the semiconductor substrate. The second pad layer and a portion of the STI structure between the two trenches are etched to form a ridge. A liner is formed on interior surface of the trenches. A first polysilicon layer is formed on the liner. A capacitor dielectric layer is formed on the first polysilicon layer. The two adjacent trenches are filled with a second polysilicon layer. The second polysilicon layer is then etched until the capacitor dielectric layer is exposed. The fabrication process is easy to integrate to SoC chip.

10 Claims, 29 Drawing Sheets

TRENCH-CAPACITOR DRAM DEVICE AND MANUFACTURE METHOD THEREOF

CROSS REFERENCE TO RELATED APPLICATIONS

This application claims priority from U.S. application Ser. No. 11/420,222 by Su et al., filed May 25, 2006, entitled "Trench-Capacitor Dram Device And Manufacture Method Thereof".

BACKGROUND OF THE INVENTION

1. Field of the Invention

The present invention relates generally to semiconductor devices, and more particularly, to a deep trench capacitor dynamic random access memory (DRAM) cell and manufacture method thereof.

2. Description of the Prior Art

A memory cell of a DRAM is composed of a metal oxide semiconductor (MOS) transistor connected to a capacitor. The MOS transistor comprises a gate, and a first and second doped regions. The doped regions are used as a source or a drain depending on the operational situation of the MOS transistor. The MOS transistor functions by using the gate electrically connected to a word line as a switch, using the source electrically connected to a bit line as a current transporting path, and using the drain electrically connected to a storage node of the capacitor to complete data accessing.

The capacitor, composed of a top electrode, a capacitor dielectric layer and a storage node, is formed on a silicon oxide layer over a substrate. In a present DRAM process, the capacitor is designed as either a stack capacitor stacked on the substrate or a deep trench capacitor buried within the substrate.

Please refer to FIG. 1 to FIG. 6. FIGS. 1-6 are schematic, cross-sectional diagrams showing a method of fabricating a trench capacitor of a DRAM device according to the prior art method. As shown in FIG. 1, a pad layer 14 composed of a silicon nitride layer and a pad oxide layer is formed on a substrate 12 of a semiconductor wafer. A photoresist layer (not shown) is formed on the surface of the pad layer 14. Next, a photolithographic process and etching process are performed to form an opening 16 in the pad layer 14 to define the position of the deep trench.

As shown in FIG. 2, an etching process is performed using the pad layer 14 as a mask to etch the opening 16 down to the substrate 12 to form a deep trench 18 with a depth of 7-8 micrometers (μm). Subsequently, an arsenic silicate glass (ASG) diffusion method is used to form a N-doped buried plate 20 as a top plate of the capacitor within the substrate 12 and beneath the deep trench 18.

As shown in FIG. 3, a chemical vapor deposition (CVD) process is performed to form a silicon nitride layer (not shown) on the surface of the deep trench 18. Next, a thermal oxidation process is performed to grow an oxide layer (not shown) on the silicon nitride layer, so that the silicon nitride layer together with the oxide layer form a capacitor dielectric layer 22. Next, a N-doped polysilicon layer 24 is deposited into and completely fills in the deep trench 18, to function as a primary conductor of the storage node. A planarization process, such as a chemical mechanical polishing (CMP) or an etching back process, is performed using the pad layer 14 as a stop layer to remove portions of the doped polysilicon layer 24 and align its surface with the pad layer 14.

As shown in FIG. 4, a first polysilicon recess etching process is performed to etch the doped polysilicon layer 24 down to the surface of the substrate 12. A wet etching process is then performed, using phosphoric acid ($H_3PO_4$) as the etching solution, to remove about half the depth of the capacitor dielectric layer 22 so as to expose the area of the substrate 12 in the upper region of the deep trench 18.

As shown in FIG. 5, another thermal oxidation process is performed to form a pair of collar oxides 26, with a thickness of 200-300 angstroms, on the exposed substrate 12 in the upper region of the deep trench 18. A N-doped polysilicon layer 27 is deposited on the surface of the semiconductor wafer and fills in the deep trench 18, followed by a planarization process to remove portions of the doped polysilicon layer 27 and approximately align the surface of the doped polysilicon layer 27 with that of the pad layer 14. A second polysilicon recess etching process is performed to etch back portions of the doped polysilicon layer 27 and lower the surface of the remaining doped polysilicon layer 27 down to the surface of the collar oxides 26.

As shown in FIG. 6, an etching process is performed to remove portions of the collar oxides 26 so as to expose the substrate 12 in the deep trench 18. A CVD process is then performed to deposit a polysilicon layer 28 on the semiconductor wafer. Next, a planarization process is performed using the pad layer 14 as a stop layer to remove portions of the polysilicon layer 28 and approximately align the surface of the remaining polysilicon layer 28 with that of the pad layer 14. A third polysilicon recess etching process is performed to etch back the polysilicon layer 28 and lower its surface down to the pad layer 14. Finally, the pad layer 14 is completely removed to finish the fabrication of the storage node.

In the prior art method, a phase-in polysilicon filling is used to fabricate the storage node, which requires a three-time repeated operational cycle of deposition, planarization and recess etching processes. Thus, it not only complicates the fabrication process but also increases both production cost and time. In addition, the prior art trench-capacitor DRAM device has a drawback in that so-called trench induced junction leakage adversely affects data storage and reliability.

SUMMARY OF THE INVENTION

It is one object of the present invention to provide a method for fabricating a deep trench capacitor in order to simplify the production process and to solve the above-mentioned problems.

It is another object of the present invention to provide a trench capacitor DRAM cell that is able to integrate with next-generation logic processes and fully support system-on-chip (SoC).

According to the claimed invention, a method for fabricating a trench capacitor of a dynamic random access memory (DRAM) device is disclosed. A semiconductor substrate having thereon a first pad layer is provided. A shallow trench isolation (STI) structure is embedded into the first pad layer and the semiconductor substrate. A second pad layer is deposited over the first pad layer and the STI structure. Two adjacent trenches are etched into the first, second pad layers, the STI structure and the semiconductor substrate. The STI structure is between the two adjacent trenches. The second pad layer and a portion of the STI structure between the two adjacent trenches are etched away to form a ridge between the two adjacent trenches. The ridge's top is lower than a main surface of the semiconductor substrate. An insulation liner is formed on interior surface of the two trenches including surface of the ridge. A first polysilicon layer is formed on the insulation liner within the trenches. The first polysilicon layer overlies the ridge and connects the two adjacent trenches. A capacitor dielectric layer is formed on the first polysilicon layer. The two adjacent trenches are filled with a second polysilicon layer on the capacitor dielectric layer. The second polysilicon layer is etched until the capacitor dielectric layer that is directly above the ridge is exposed.

From one aspect, the present invention provides a dual-trench capacitor structure comprising a semiconductor substrate having a main surface, two deep trenches in close proximity to each other in the semiconductor substrate, a ridge between the two deep trenches, an insulation liner conformally lining interior surface of the two deep trenches, a first polysilicon layer covering the insulation liner and overlying the ridge within the two deep trenches, a capacitor dielectric layer on the first polysilicon layer, and a second polysilicon layer filling the two deep trenches.

These and other objectives of the present invention will no doubt become obvious to those of ordinary skill in the art after reading the following detailed description of the preferred embodiment that is illustrated in the various figures and drawings.

DETAILED DESCRIPTION

In general, the prior art method for fabricating a trench capacitor of a DRAM device can be categorized into the following phases.

Phase 1: deep trench etching.
Phase 2: buried plate and capacitor dielectric formation.
Phase 3: first polysilicon deep trench fill and first recess etching.
Phase 4: collar oxide formation.
Phase 5: second polysilicon deposition and second recess etching.
Phase 6: third polysilicon deposition and third recess etching.
Phase 7: STI process.

It is disadvantageous to use the above-described prior art method for fabricating a trench capacitor of a DRAM device because the prior art processes are complicated and time-consuming. Besides, it is difficult to integrate into a system-on-chip (SoC) chip.

Figure 1:
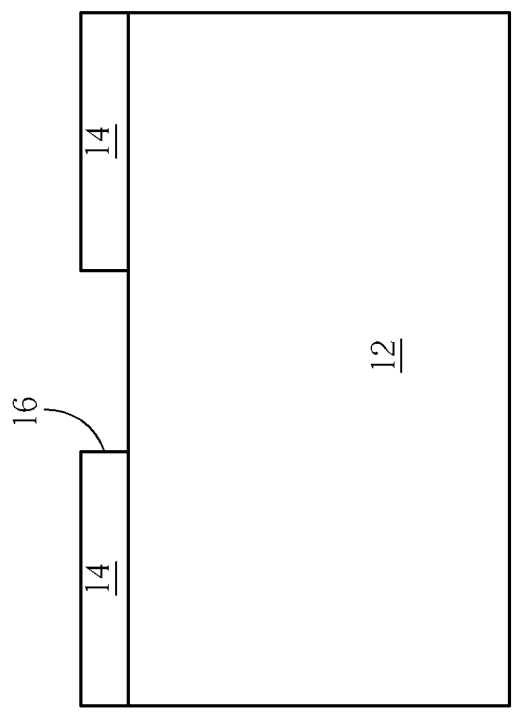
FIG. 1 to FIG. 6 are schematic, cross-sectional diagrams showing a method of fabricating a DRAM deep trench capacitor according to the prior art method.
Figure 2:
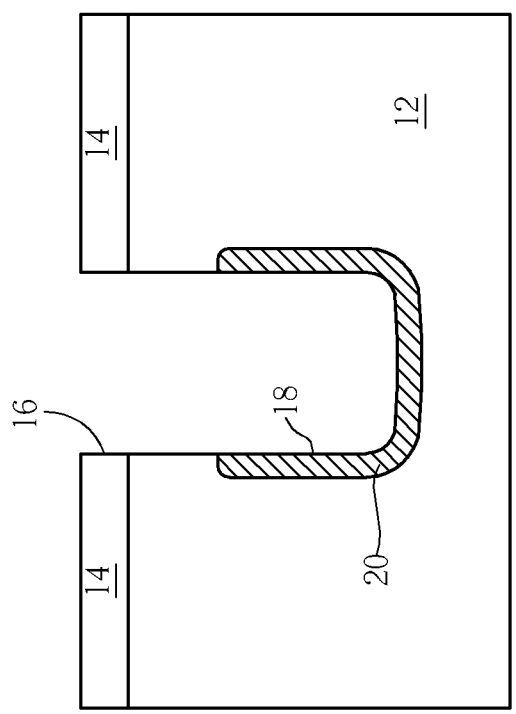
Figure 3:
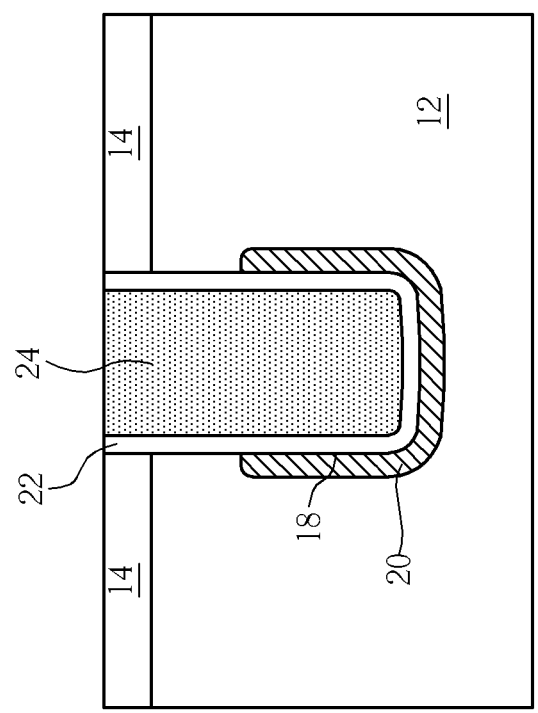
Figure 4:
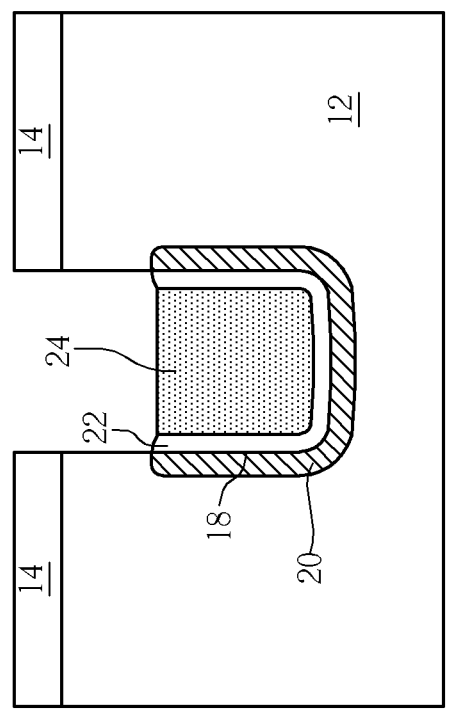
Figure 5:
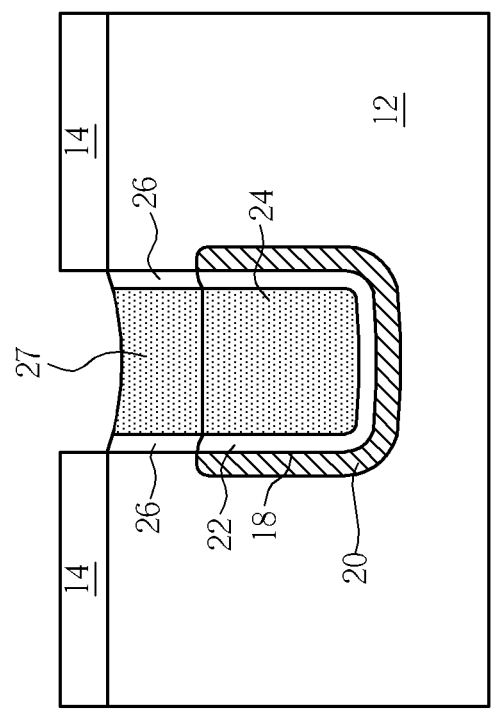
Figure 6:
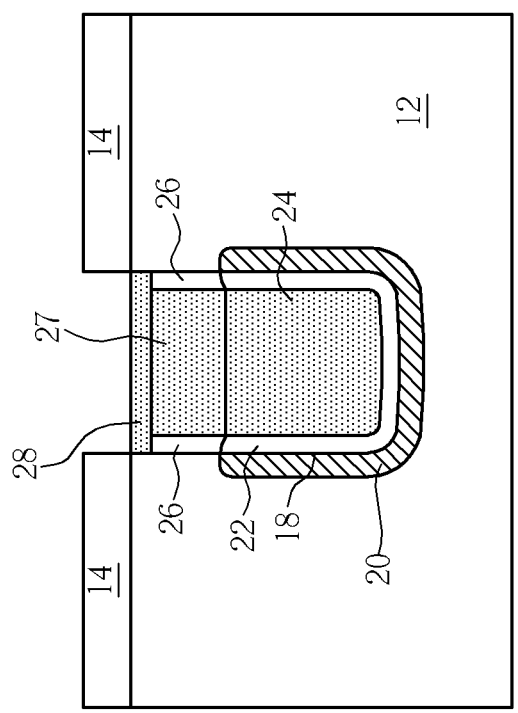
Figure 7:
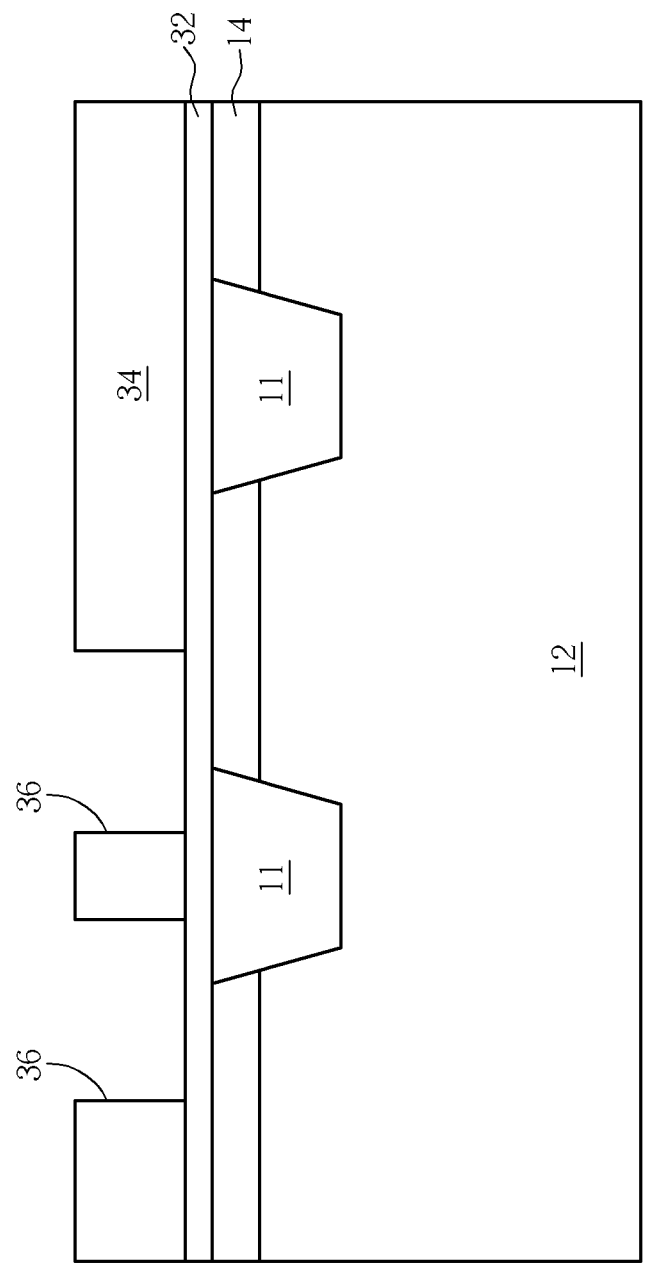
FIG. 7 to FIG. 22 are schematic, cross-sectional diagrams showing the preferred exemplary method of fabricating a trench-capacitor DRAM device in accordance with one preferred embodiment of this invention.

Please refer to FIG. 7 to FIG. 11. FIG. 7 to FIG. 11 are schematic, cross-sectional diagrams showing the preferred exemplary method of fabricating a trench-capacitor DRAM device in accordance with one preferred embodiment of this invention, wherein like numeral numbers designate like layers, elements or devices. As shown in FIG. 7, a semiconductor substrate 12 is provided. A pad layer 14 is deposited over the semiconductor substrate 12. The pad layer 14 may comprise a pad oxide layer (not explicitly shown) and a pad nitride layer stacked on the pad oxide layer. A conventional shallow trench isolation (STI) process is performed to form STI structures 11 within the semiconductor substrate 12. The STI process includes a chemical mechanical polishing (CMP) process that is used to remove the extra trench fill material such as HDPCVD oxide from the top surface of the pad layer 14.

After the CMP process, the semiconductor substrate 12 has a substantially planar surface. After the formation of the STI structure 11, a layer of silicon nitride 32 is blanket deposited over the planar surface of the semiconductor substrate 12. The silicon nitride layer 32 covers the STI structures 11 and the top surface of the pad layer 14. Preferably, the silicon nitride layer 32 has a thickness of about 500-2000 angstroms. A lithographic process is then carried out to form a photoresist layer 34 on the silicon nitride layer 32. The photoresist layer 34 has openings 36 that expose a portion of the underlying silicon nitride layer 32.

Figure 8:
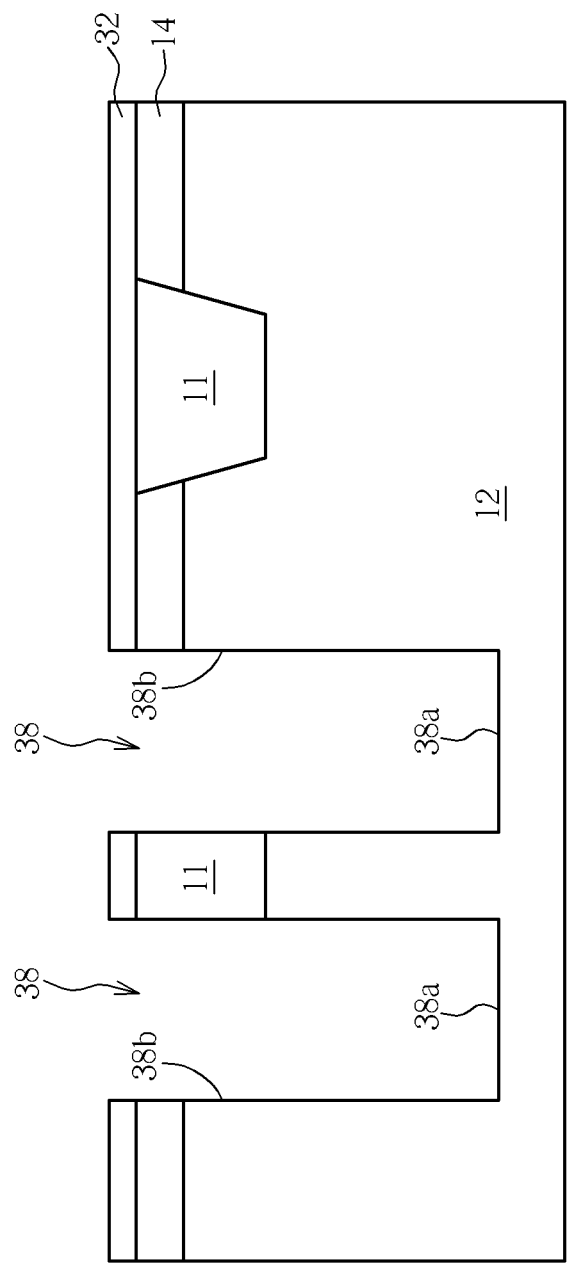

As shown in FIG. 8, a dry etching process is then carried out to etch two adjacent deep trenches 38 into the silicon nitride layer 32, the pad layer 14, the STI structure 11 and the semiconductor substrate 12 through the openings 36. The depth of the deep trenches 38 may ranges between 6000-12000 angstroms. Each deep trench 38 has a flat trench bottom 38a and trench sidewall 38b. The remaining STI structure 11 is interposed between the two adjacent deep trenches 38.

Figure 9:
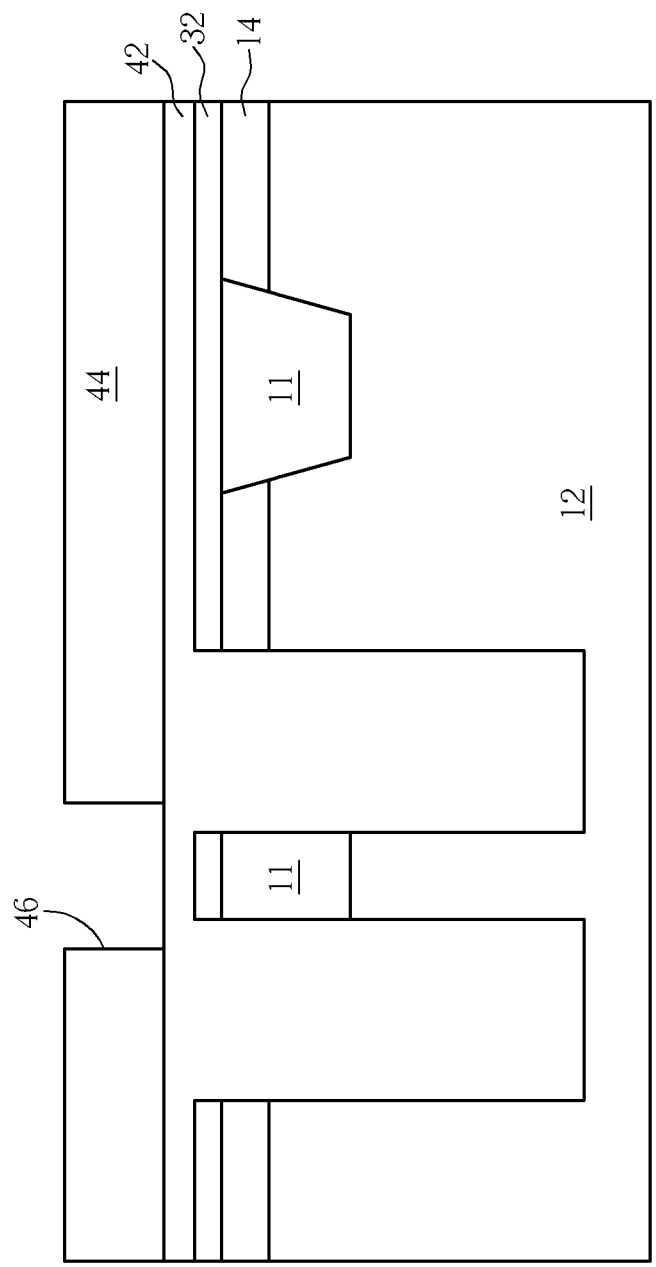

As shown in FIG. 9, the two adjacent deep trenches 38 are filled with a bottom anti-reflection coating (BARC) 42. The BARC 42 also covers the top surface of the silicon nitride layer 32. A lithographic process is then carried out to form a photoresist layer 44 on the BARC 42. The photoresist layer 44 has an opening 46 that expose a portion of the underlying BARC 42. The opening 46 overlaps with the remaining STI structure 11 between the two adjacent deep trenches 38.

Figure 10:
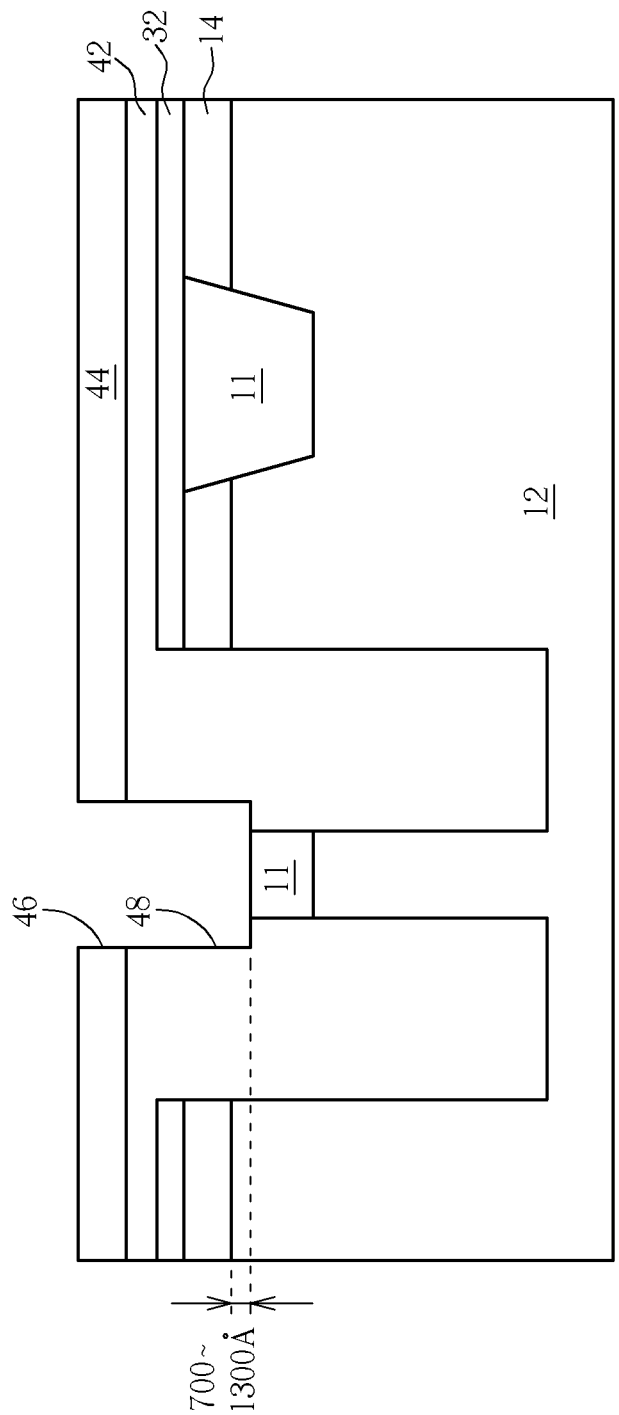

As shown in FIG. 10, a dry etching process is then carried out to etch the BARC 42, the silicon nitride layer 32 and the STI structure 11 through the opening 46, thereby forming a recess 48. The recess 48 has a bottom surface that is lower than the main surface of the semiconductor substrate 12 by 300-2000 angstroms, preferably 700-1300 angstroms.

Figure 11:
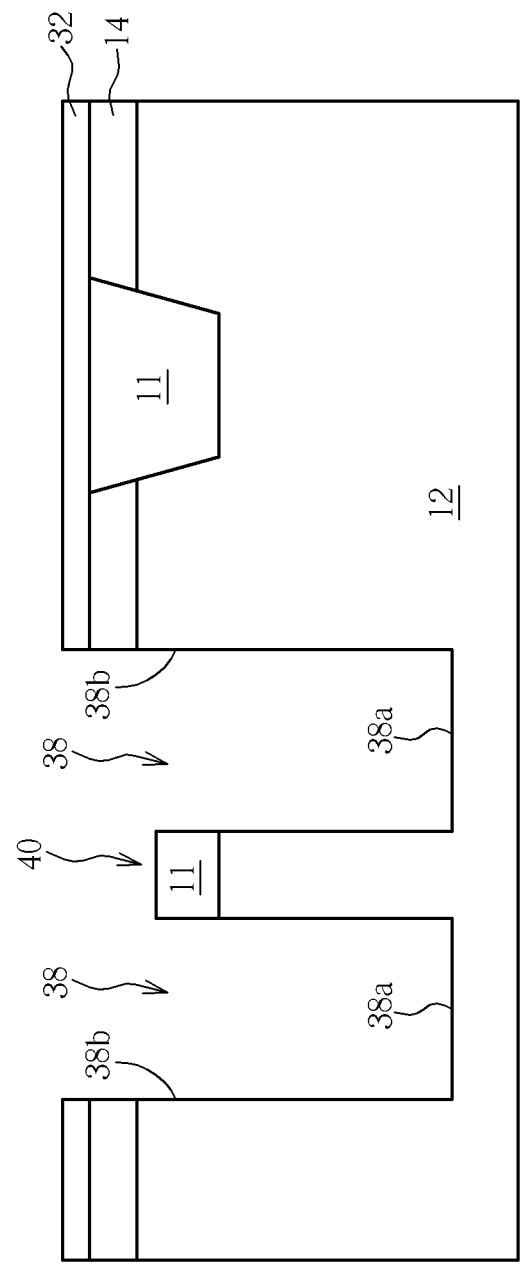
Figure 12:
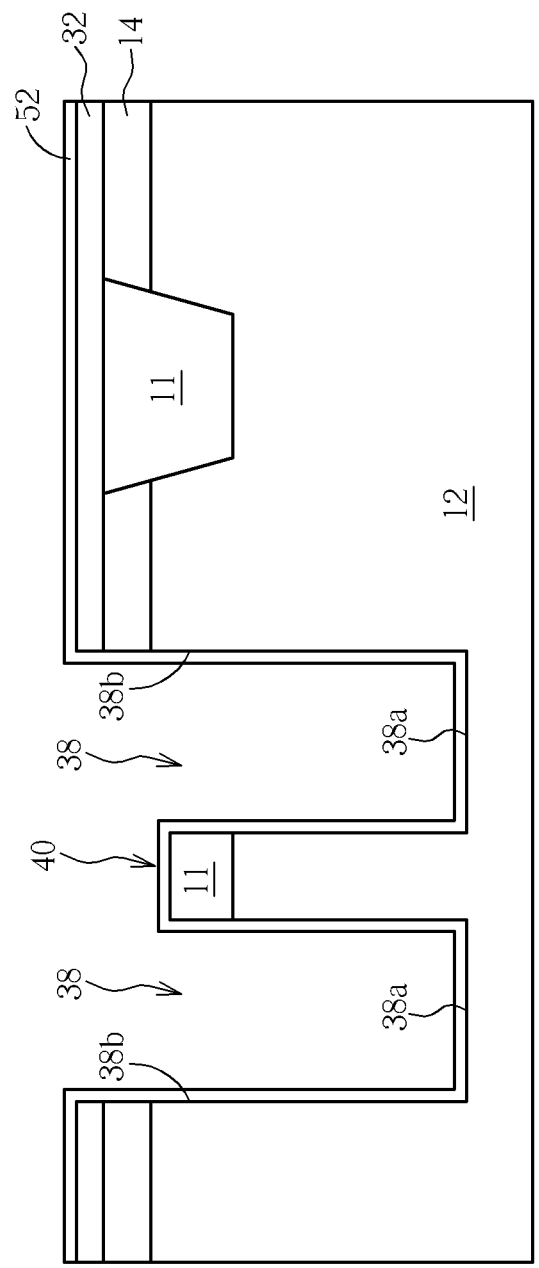

As shown in FIG. 11, the photoresist layer 44 and the BARC 42 are removed from the semiconductor substrate 12. At this phase, a ridge 40 is formed between the two adjacent deep trenches 38. As shown in FIG. 12, a conformal silicon oxide layer 52 is deposited on the semiconductor substrate 12 including the top surface of the silicon nitride layer 32, the interior surfaces of the two adjacent deep trenches 38, and on the ridge 40. Preferably, the silicon oxide layer 52 has a thickness of about 30-300 angstroms.

Figure 13:
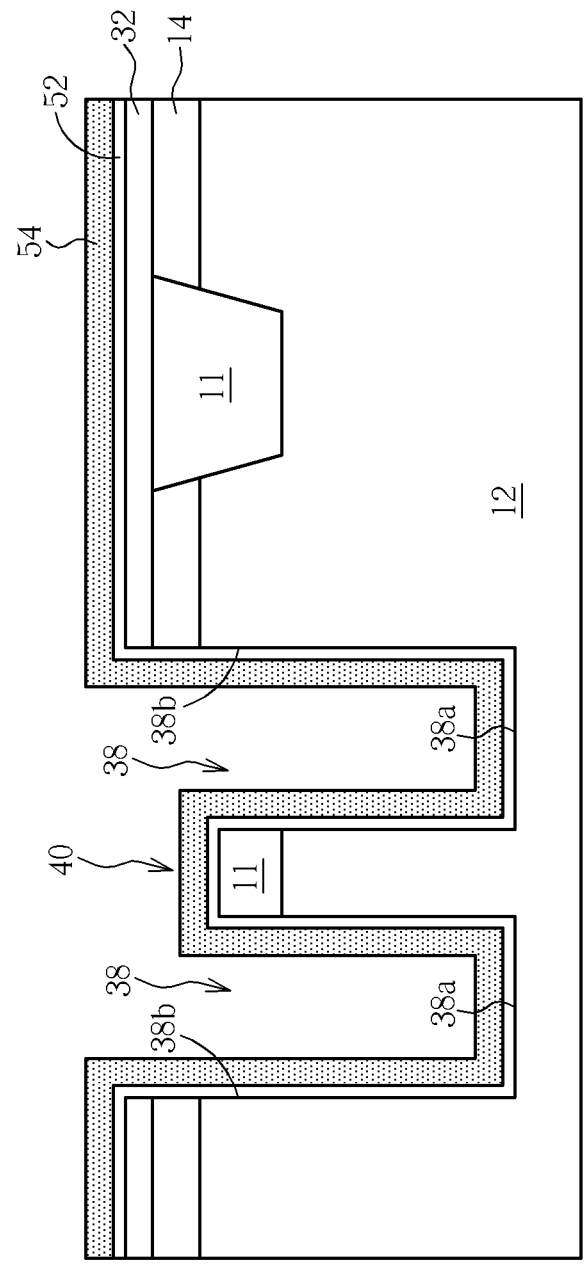

As shown in FIG. 13, a chemical vapor deposition (CVD) process is performed to deposit a conformal polysilicon layer 54 over the silicon oxide layer 52. The polysilicon layer 54 does not fill the deep trenches 38. Preferably, the polysilicon layer 54 has a thickness of 300-1000 angstroms. The polysilicon layer 54 may be doped with impurities such as phosphorous or arsenic in-situ or ex-situ.

Figure 14:
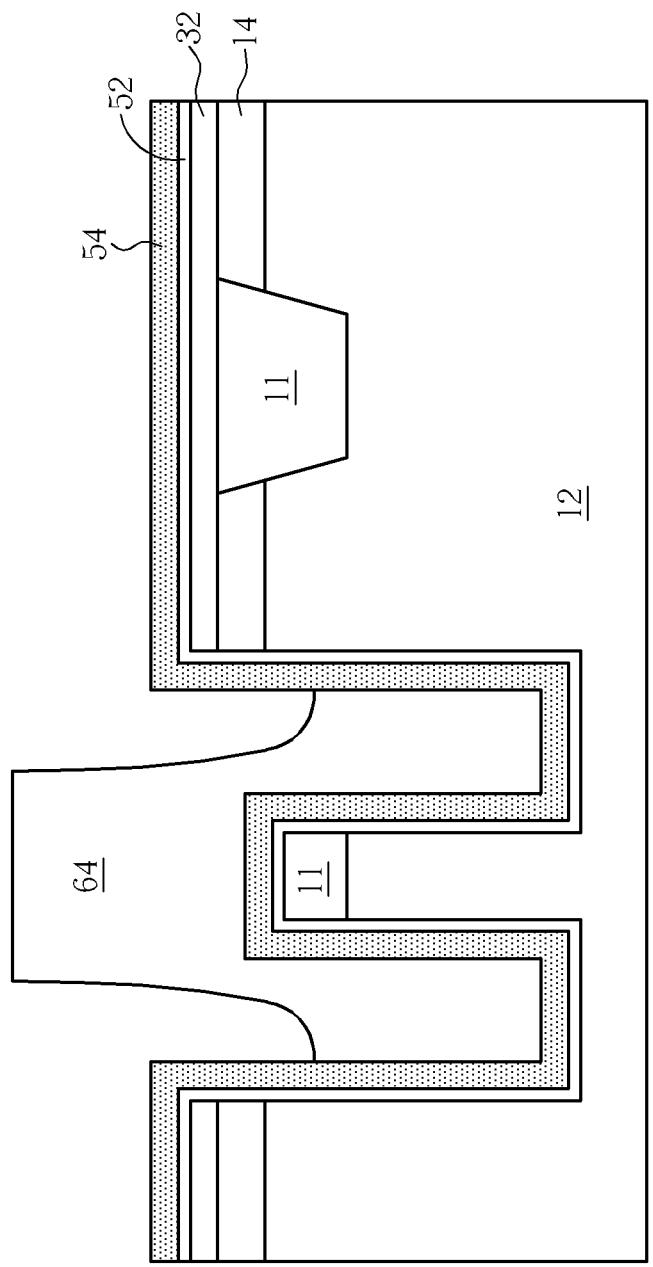

As shown in FIG. 14, a photoresist layer is coated on the polysilicon layer 54 and fills the deep trenches 38. The photoresist layer is subjected to exposure and development to form a photoresist pattern 64 that only masks the polysilicon layer 54 within the deep trenches 38.

Figure 15:
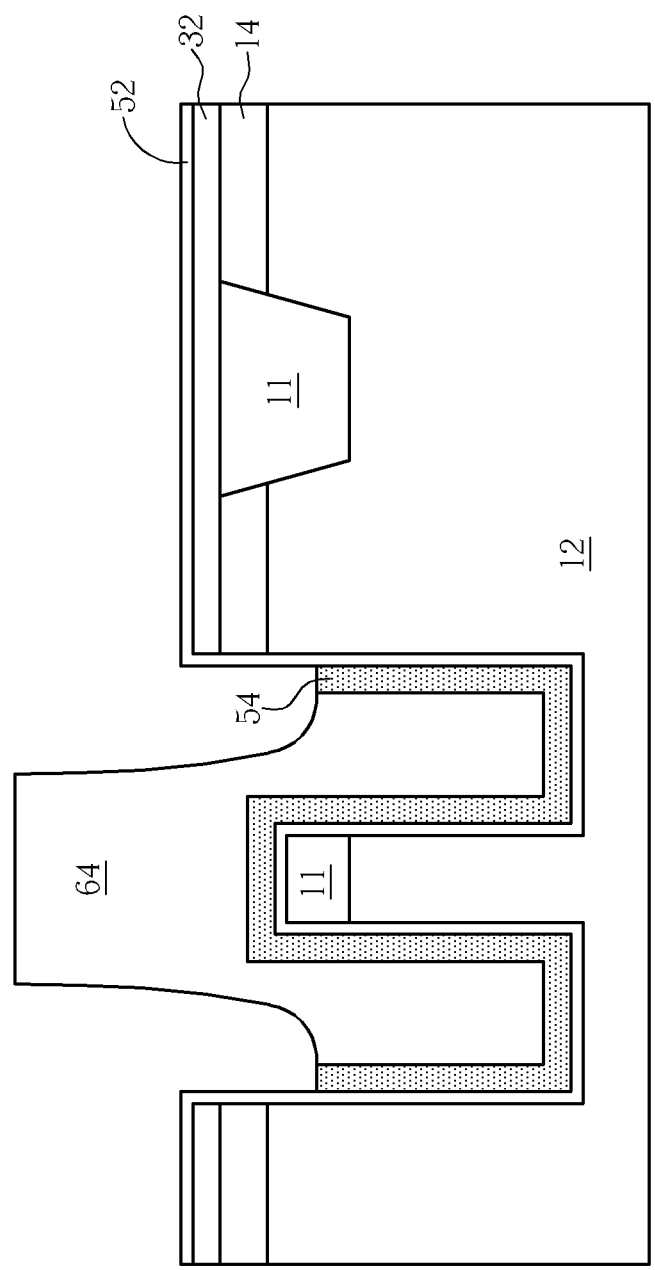

As shown in FIG. 15, the polysilicon layer 54 that is not covered by the photoresist pattern 64 is removed.

Figure 16:
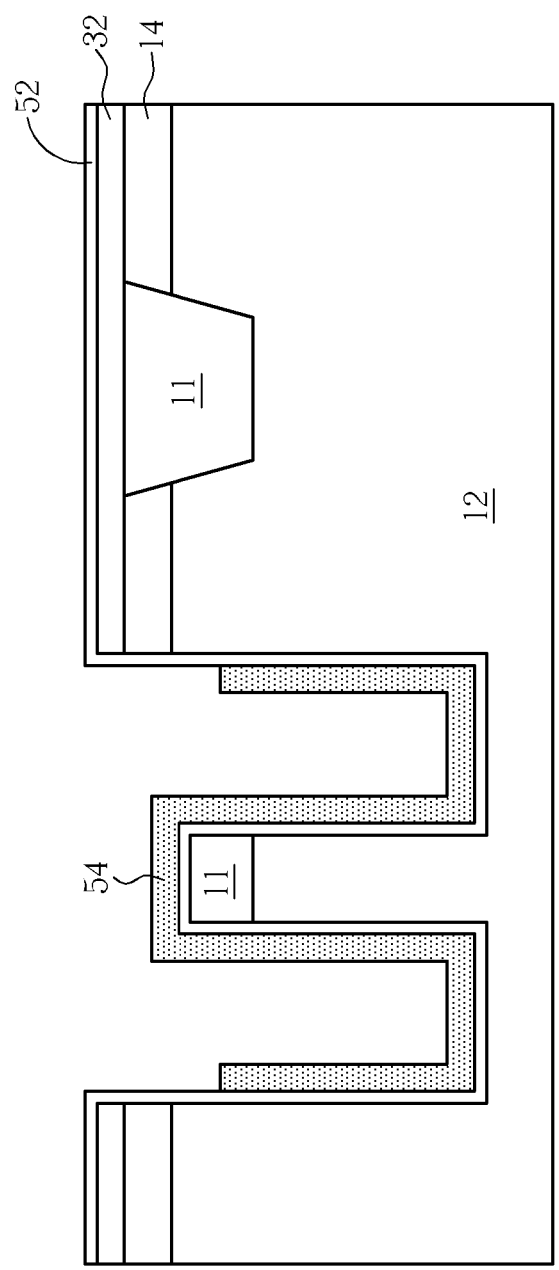

As shown in FIG. 16, the photoresist pattern 64 is then stripped. The remaining polysilicon layer 54, which acts as a bottom plate electrode of the trench capacitor of a DRAM cell, interconnects the two deep trenches via the ridge 40.

Optionally, after the removal of the photoresist pattern 64, a surface rough process for increasing the surface area of the capacitor bottom plate electrode is performed. For example, hemispherical silicon grains (HSG) may be formed on the polysilicon layer 54 to increase the capacitance.

Figure 17:
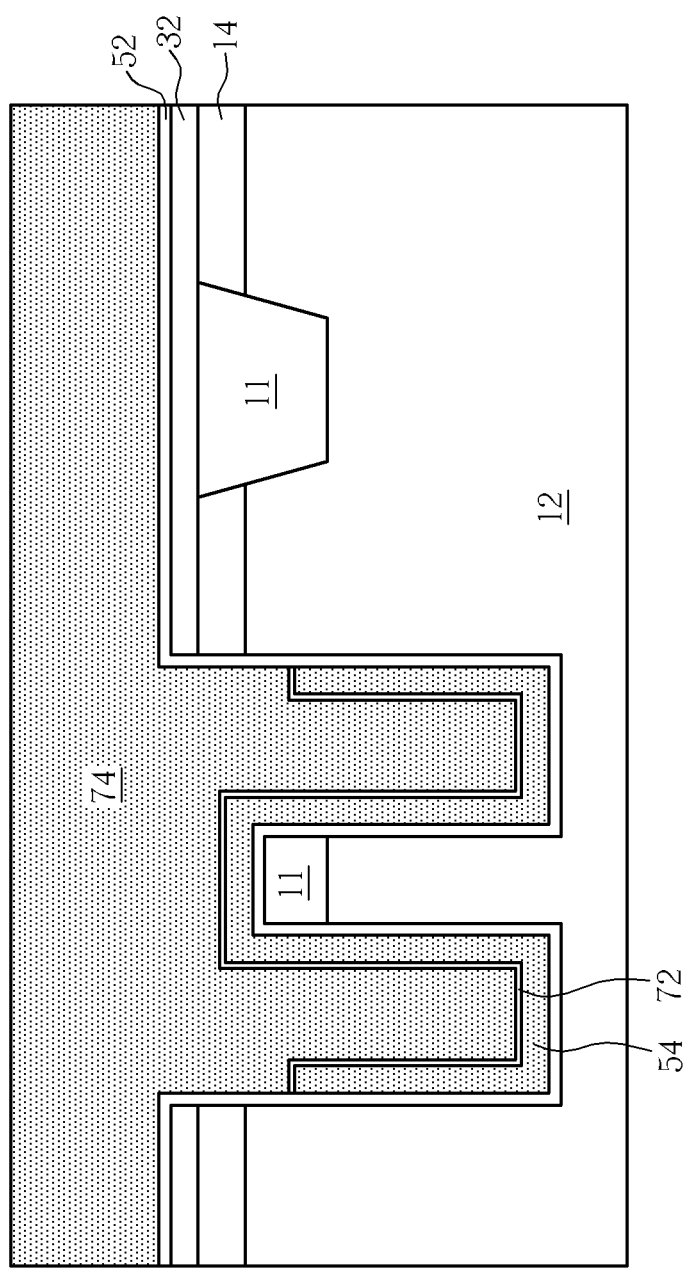

As shown in FIG. 17, an oxide-nitride-oxide (ONO) dielectric layer 72 is formed on the polysilicon layer 54 within the deep trenches 38. According to the preferred embodiment, the ONO dielectric layer 72 has a thickness of about 40-60 angstroms, preferably 52 angstroms. A second polysilicon deposition process is carried out to deposit a doped polysilicon layer 74 on the semiconductor substrate 12. The doped polysilicon layer 74 fills the deep trenches 38 and covers the silicon oxide layer 52 and the ONO dielectric layer 72.

Conventional chemical vapor deposition (CVD) such as LPCVD or PECVD can be used to deposit the doped polysilicon layer 74. Preferably, the thickness of the doped polysilicon layer 74 ranges between 3000 and 5000 angstroms, more preferably 4000 angstroms.

Figure 18:
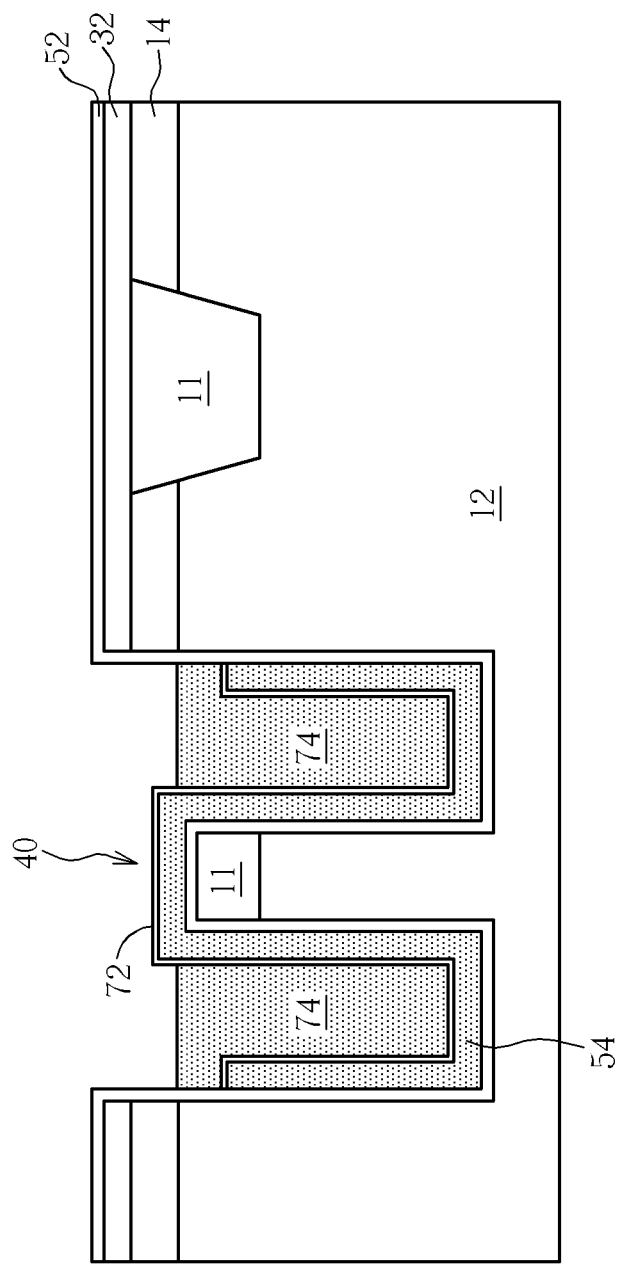

As shown in FIG. 18, an etching process such as a plasma dry etching process is performed to recess the polysilicon layer 74 until the ONO dielectric layer 72 directly above the ridge 40 is exposed. After the etching process, the top surface of the polysilicon layer 74 is approximately coplanar with the surface of the semiconductor substrate 12. The polysilicon layer 74 acts as a top electrode or storage node of the trench capacitor.

Figure 19:
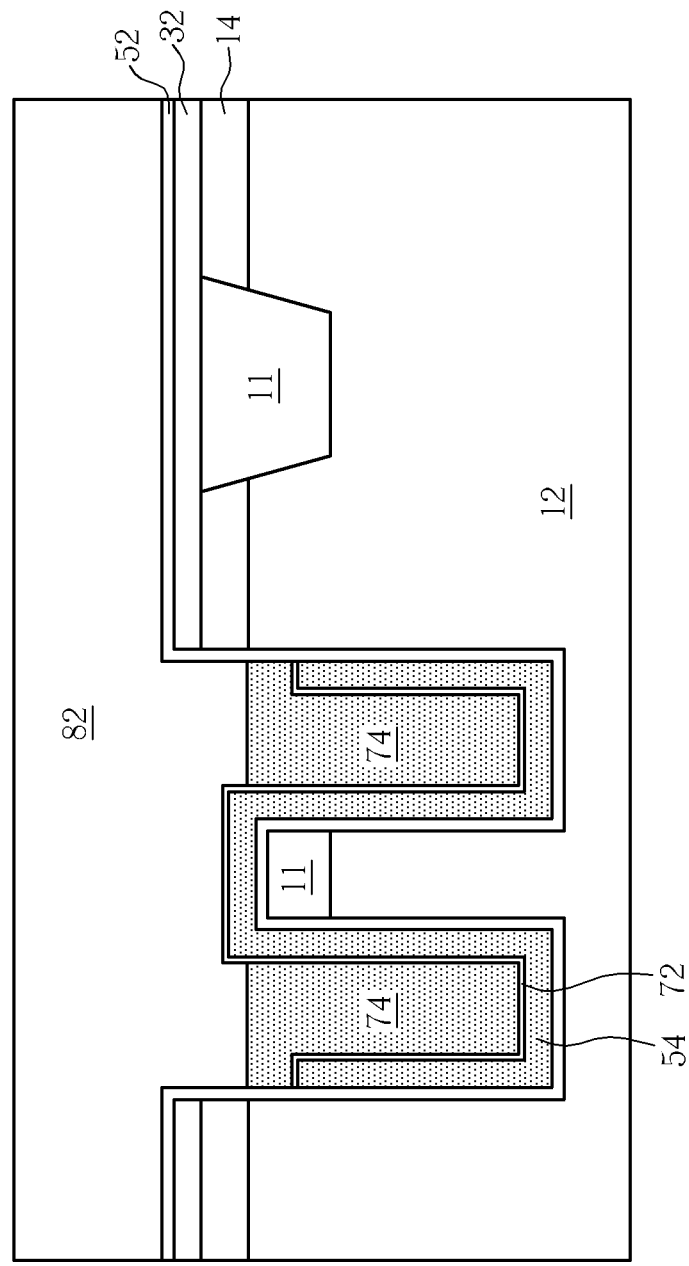

As shown in FIG. 19, according to one preferred embodiment, a silicon oxide layer 82 is deposited on the semiconductor substrate 12. The silicon oxide layer 82 fills the trenches 38 and covers the exposed ONO dielectric layer 72 on the ridge 40, the polysilicon layer 74 and the silicon oxide layer 52. To form the silicon oxide layer 82, a conventional LPCVD method using (tetra-ethyl-ortho-silicate, TEOS) as a precursor may be employed to deposit a TEOS oxide layer over the semiconductor substrate 12.

Figure 20:
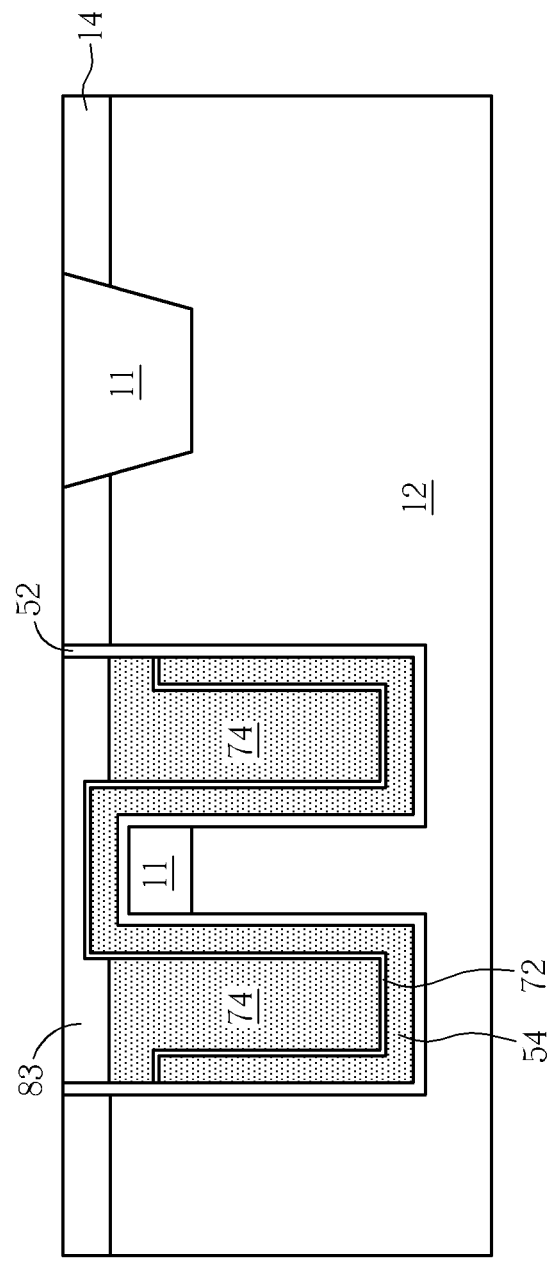

As shown in FIG. 20, a CMP process is carried out to polish the silicon oxide layer 82 using the silicon nitride layer 32 as a polish stop layer. After the CMP, the remaining silicon oxide layer becomes trench top oxide (TTO) 83 insulating the polysilicon layer 74.

Figure 21:
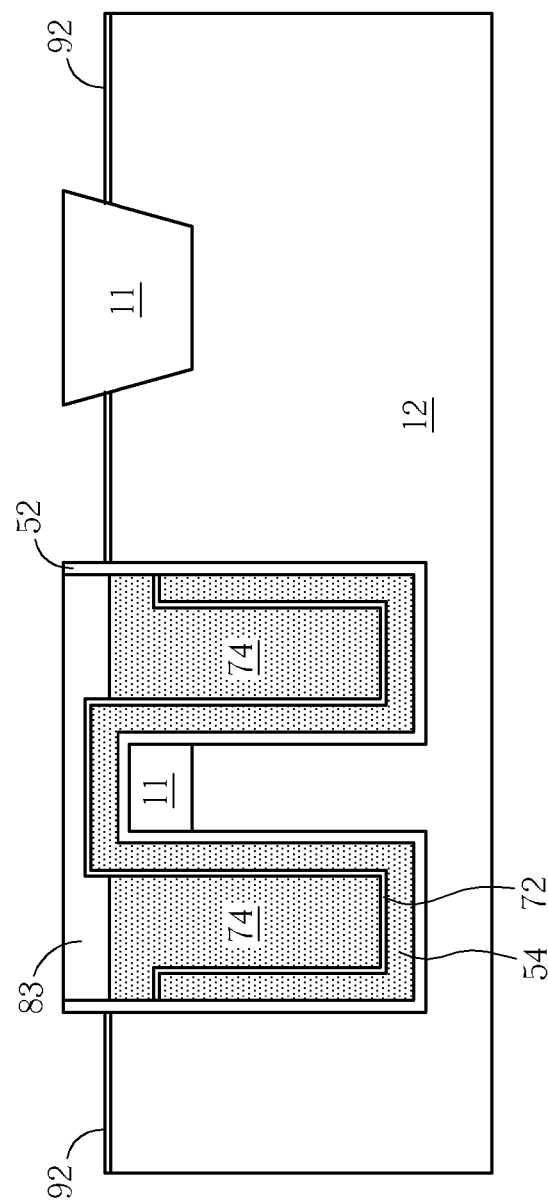

As shown in FIG. 21, the pad layer 14 is removed from the surface of the semiconductor substrate 12. Subsequently, an oxidation process is carried out to form a gate oxide layer 92 on the active areas of the semiconductor substrate 12. The pad layer 14 may be removed by using conventional wet etching methods such as hot phosphoric acid solution or by using dry etching or vapor etching methods. For example, the nitride can be selectively removed using a gas mixture comprising hydrogen fluoride vapor and oxidizing agent such as $HNO_3$, $O_3$, $H_2O_2$, HClO, $HNO_2$, $O_2$, $H_2SO_4$, $Cl_2$, or $BR_2$ at properly controlled process temperatures. In still another case, the pad nitride layer 15 may be removed by using anhydrous hydrogen halogenide such as HF or HCl gas.

Figure 22:
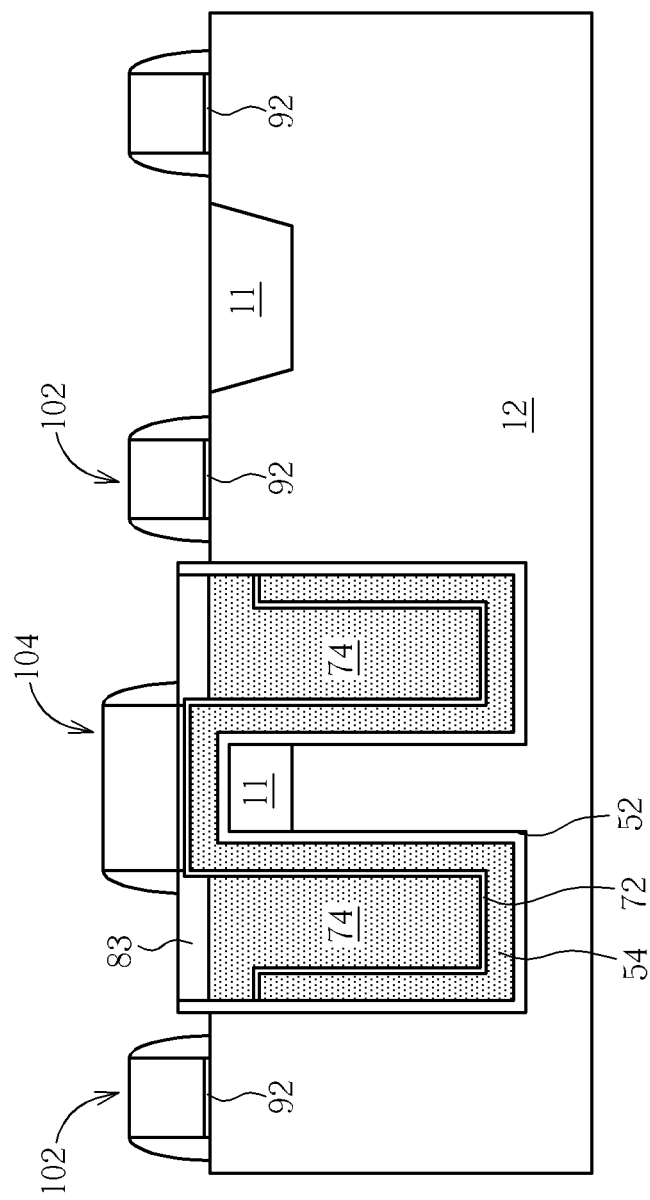

As shown in FIG. 22, a gate 102 for control the trench capacitor and a passing gate 104 are formed on the gate oxide layer 92 and on the TTO layer 83, respectively. Typically, each of the gate 102 and passing gate 104 has a polysilicon layer and sidewall nitride spacer. According to this embodiment, the passing gate 104 is a floating gate.

Please refer to FIGS. 23-26. FIGS. 23-26 are schematic, cross-sectional diagrams showing the method of fabricating a trench-capacitor DRAM device in accordance with another preferred embodiment of this invention.

Figure 23:
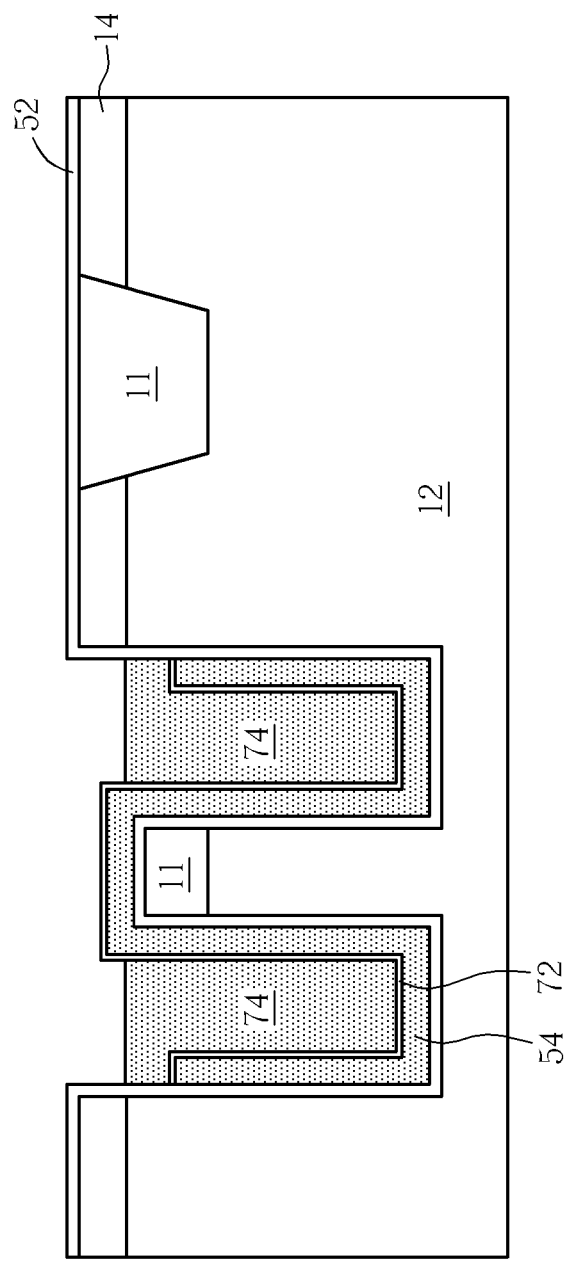
FIGS. 23-26 are schematic, cross-sectional diagrams showing the method of fabricating a trench-capacitor DRAM device in accordance with another preferred embodiment of this invention.

As shown in FIG. 23, in this embodiment, unlike the previous preferred embodiment, the silicon nitride layer 32 is not used. The silicon oxide layer 52 is deposited directly on the pad layer 14. The fabrication process for forming the dual trench capacitor structure depicted in FIG. 23 is the same as the previously described preferred embodiment as set forth in FIGS. 7-18.

Figure 24:
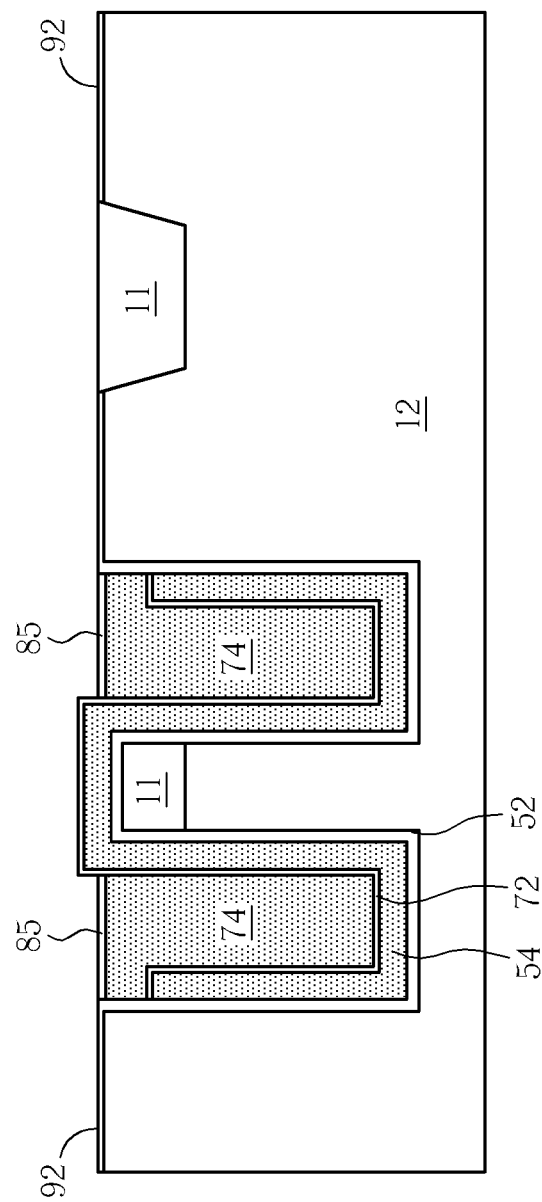

As shown in FIG. 24, after recessing the polysilicon layer 74, the silicon oxide layer 52 and the pad layer 14 outside the trenches 38 are both removed from the surface of the semiconductor substrate 12. Subsequently, an oxidation process is carried out, thereby forming a gate oxide layer 92 on the active areas of the semiconductor substrate 12 and, simultaneously, forming an insulation layer 85 on the exposed surface of the polysilicon layer 74.

Figure 25:
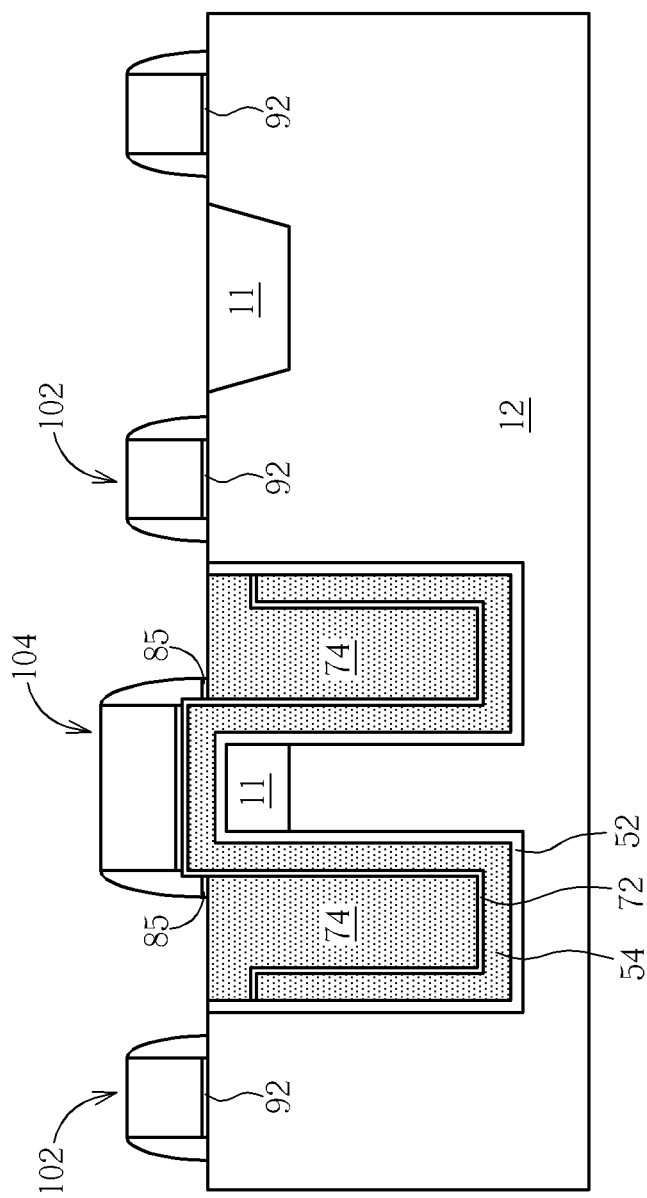

As shown in FIG. 25, a gate 102 for control the trench capacitor is formed on the gate oxide layer 92. A dummy gate 104 is formed on the ONO layer 72 and insulation layer 85. Likewise, each of the gate 102 and dummy gate 104 has a polysilicon layer and sidewall nitride spacer. According to this embodiment, the dummy gate 104 is a floating gate. In another embodiment, the dummy gate 104 is omitted.

Figure 26:
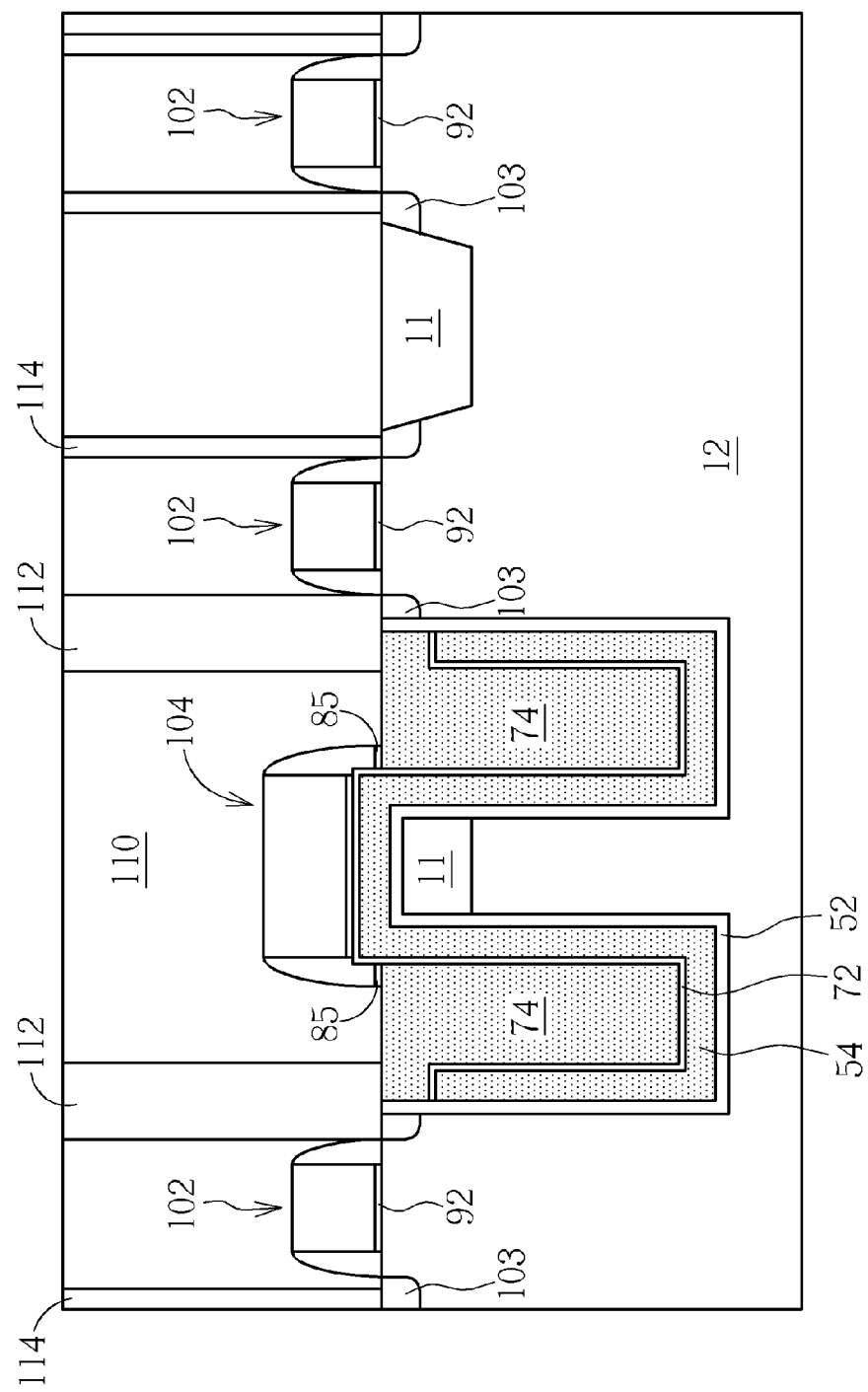

As shown in FIG. 26, an inter-layer dielectric (ILD) layer 110 such as silicon oxide is deposited over the semiconductor substrate 12. A local contact plug 112 for electrically connecting the polysilicon layer 74 with source/drain 103 of the control transistor and contact plug 114 for connecting bit line are formed in the ILD layer 110.

Figure 27:
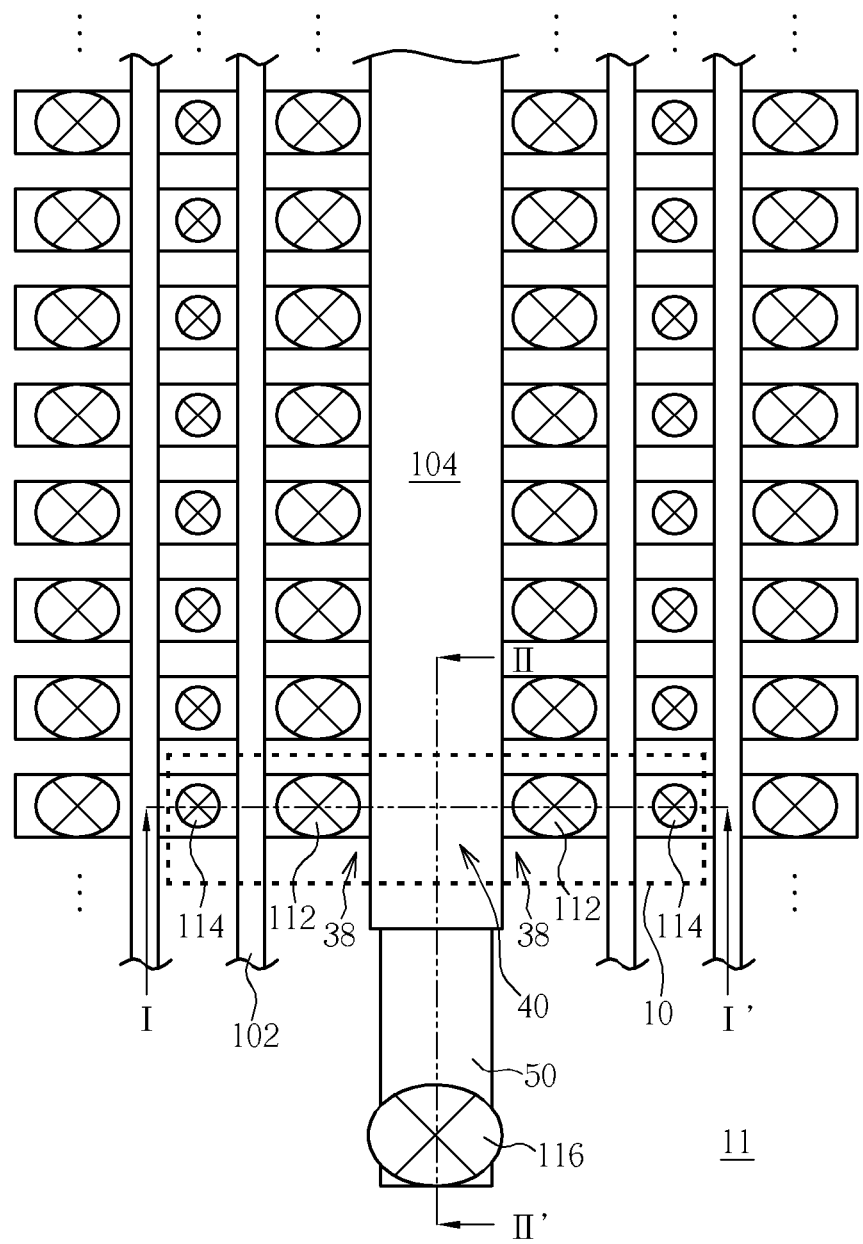
FIG. 27 is an exemplary layout of the deep trench capacitor DRAM array according to this invention.
Figure 28:
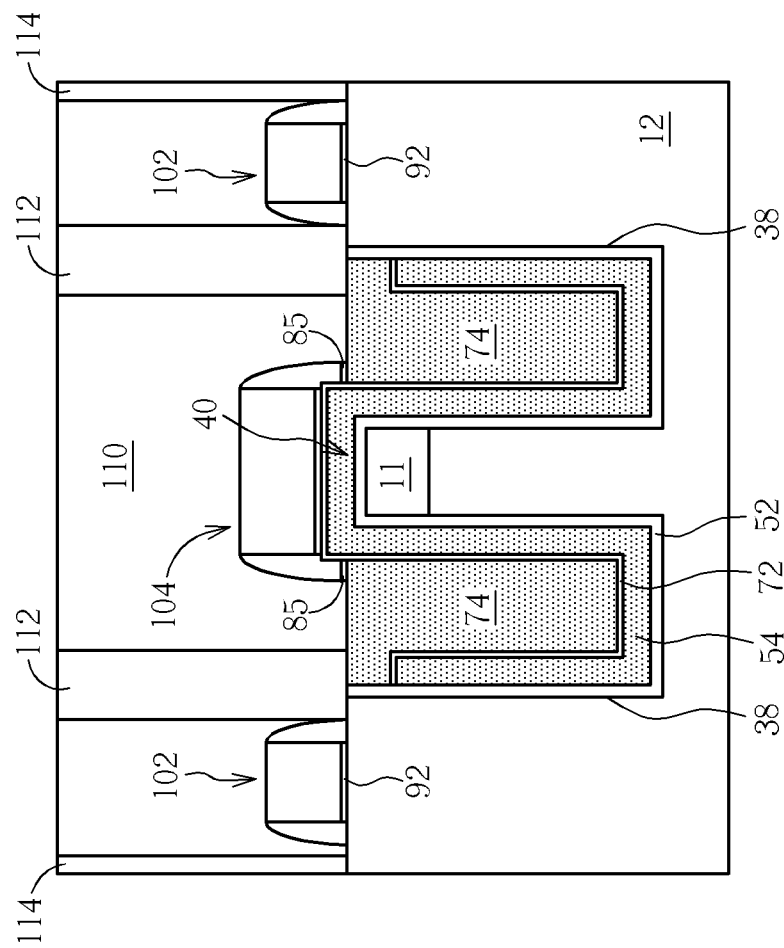
FIG. 28 is a cross-sectional view of a DRAM cell along line I-I' of FIG. 27.
Figure 29:
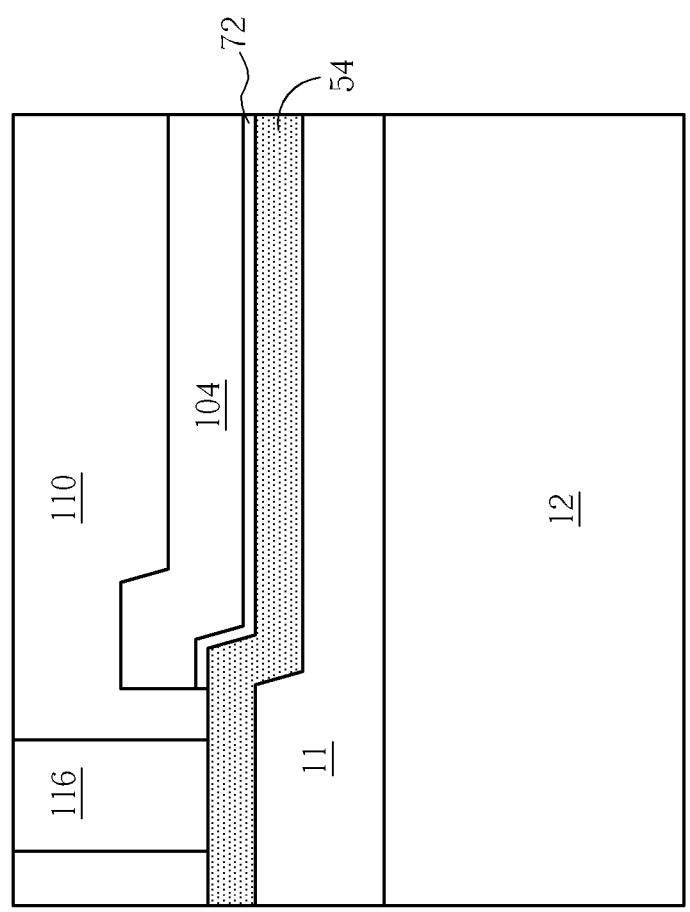
FIG. 29 is a cross-sectional view along line II-II' of FIG. 27.

Please refer to FIGS. 27-29. FIG. 27 is a top view of an exemplary layout of the deep trench capacitor DRAM array according to this invention. FIG. 28 is a cross-sectional view of a DRAM cell unit along line I-I' of FIG. 27. FIG. 29 is a cross-sectional view along line II-II' of FIG. 27. As shown in FIG. 27, the trench capacitor DRAM device comprises a DRAM cell unit 10 comprising dual trenches 38 with a ridge 40 therebetween. Capacitor structure (see FIG. 28) is fabricated within the dual trenches 38. A poly strip 50 protrudes out to the STI region 11. The poly strip 50 is fabricated simultaneously with the polysilicon layer 54 of the capacitor structure. As shown in FIGS. 28 and 29, the poly strip 50 connects the polysilicon layer 54 of each capacitor structure of the DRAM cell units along one single row to a contact 116.

Compared to the prior art, the present invention features that the top electrode 74 and the bottom electrode 54 are both made of doped polysilicon. Further, the trench capacitor structure that consists of the polysilicon layer 54, the ONO dielectric layer 72 and the polysilicon layer 74 is embedded within the dual trenches 38 in close proximity to each other and the interior surface of the dual trenches is insulated from the substrate 12. Moreover, the fabrication process is easy to integrate to SoC chip.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A dual-trench capacitor structure, comprising:
   a semiconductor substrate having a main surface;
   two independent trenches in close proximity to each other in the semiconductor substrate;
   a ridge made of an insulating material and positioned between the two independent trenches, wherein the ridge's top surface is lower than the main surface of the semiconductor substrate;

an insulation liner conformally lining interior surface of the two independent trenches, and a part of the insulation liner extending to a ridge's top surface;

a bottom plate electrode covering the insulation liner and overlying the ridge within the two independent trenches;

a capacitor dielectric layer on the bottom plate electrode, and overlapping the ridge entirely; and two storage nodes respectively filling the two independent trenches, wherein the storage nodes are isolated from each other.

2. The dual-trench capacitor structure according to claim 1 wherein the ridge is formed from a shallow trench isolation (STI) structure.

3. The dual-trench capacitor structure according to claim 1 wherein the storage node is substantially coplanar with the main surface of the semiconductor substrate.

4. The dual-trench capacitor structure according to claim 1 wherein the insulation liner comprises silicon oxide.

5. The dual-trench capacitor structure according to claim 4 wherein the insulation liner has a thickness of 30-300 angstroms.

6. The dual-trench capacitor structure according to claim 1 wherein the capacitor dielectric layer comprises oxide-nitride-oxide (ONO) dielectric.

7. The dual-trench capacitor structure according to claim 1 wherein a passing gate is positioned on and entirely overlaps the capacitor dielectric layer directly above the ridge.

8. The dual-trench capacitor structure according to claim 1 further comprising a control gate on the semiconductor substrate with a source/drain in the semiconductor substrate, and a local contact plug directly contacting the storage node and the source/drain for electrically connecting the storage node with the source/drain.

9. The dual-trench capacitor structure according to claim 1, wherein the capacitor dielectric layer on the ridge is higher than the main surface of the semiconductor substrate.

10. A dual-trench capacitor structure, comprising:
a semiconductor substrate having a main surface;
two independent trenches in close proximity to each other in the semiconductor substrate;
a ridge between the two independent trenches;
an insulation liner conformally lining interior surface of the two independent trenches, and a part of the insulation liner extending to a ridge's top surface, wherein a top surface of the insulation liner positioned on the ridge's top surface is lower than the main surface of the semiconductor substrate;
a bottom plate electrode covering the insulation liner and overlying the ridge within the two independent trenches;
a capacitor dielectric layer on the bottom plate electrode, and overlapping the ridge entirely; and
two storage nodes respectively filling the two independent trenches, wherein the storage nodes are isolated from each other.

* * * * *